(12) United States Patent
Miyahara

(10) Patent No.: US 9,214,486 B2
(45) Date of Patent: Dec. 15, 2015

(54) IMAGING DEVICE AND IMAGING APPARATUS GENERATING IMAGE INFORMATION FOR EACH OF PLURAL PIXELS FROM RECEIVED LIGHT

(71) Applicant: Panasonic Corporation, Osaka (JP)

(72) Inventor: Hiroyuki Miyahara, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 359 days.

(21) Appl. No.: 13/765,734

(22) Filed: Feb. 13, 2013

(65) Prior Publication Data
US 2013/0214130 A1    Aug. 22, 2013

(30) Foreign Application Priority Data
Feb. 16, 2012    (JP) .................................. 2012-031274

(51) Int. Cl.
*G01J 3/50*    (2006.01)
*H01L 27/146*    (2006.01)

(52) U.S. Cl.
CPC .... *H01L 27/14625* (2013.01); *H01L 27/14621* (2013.01)

(58) Field of Classification Search
CPC .................. H01L 27/14621; H01L 27/14625
USPC ........ 250/208.1, 226; 348/272, 273, 276, 279
See application file for complete search history.

(56) References Cited

U.S. PATENT DOCUMENTS

| | | | |
|---|---|---|---|
| 5,307,159 A | 4/1994 | Hieda | |
| 7,928,352 B2 * | 4/2011 | Toda | 250/208.1 |
| 2007/0153099 A1 * | 7/2007 | Ohki et al. | 348/234 |
| 2008/0075393 A1 * | 3/2008 | Kwon et al. | 382/300 |
| 2008/0128598 A1 * | 6/2008 | Kanai et al. | 250/226 |
| 2010/0141812 A1 | 6/2010 | Hirota | |

FOREIGN PATENT DOCUMENTS

| | | |
|---|---|---|
| JP | 3-114388 | 5/1991 |
| JP | 2010-136225 | 6/2010 |
| JP | 2010-136226 | 6/2010 |

* cited by examiner

*Primary Examiner* — Thanh Luu
(74) *Attorney, Agent, or Firm* — Panasonic Patent Center

(57) ABSTRACT

An imaging apparatus includes an imaging device which includes a plurality of pixels and is operable to generate image information for each pixel from received light. Each of the plurality of pixels includes one of first to fourth color filters. Each of the first to the fourth color filters has different spectral characteristics. The fourth color filter has the highest light transmittance among the color filters. The first to the fourth color filters are arranged in a specific array. The specific array has first to third centroids which make a Bayer array.

18 Claims, 27 Drawing Sheets

Fig. 7

| R1 | Gr1 | R3 | Gr3 |
|----|-----|----|-----|
| Gb1 | B1 | Gb3 | B3 |
| W1 | G | W3 | G |
| G | W2 | G | W4 |
| R2 | Gr2 | R4 | Gr4 |
| Gb2 | B2 | Gb4 | B4 |

Fig. 8

| R1 | Gr1 | R3 | Gr3 |
|----|-----|----|-----|
| Gb1 | B1 | Gb3 | B3 |
| W1 | (R') | (Gr') | G |
| G | (Gb') (W') (B') | | W4 |
| R2 | Gr2 | R4 | Gr4 |
| Gb2 | B2 | Gb4 | B4 |

| R1  | Gr1 | R3  | Gr3 |
| --- | --- | --- | --- |
| G   | W   | G   | W   |
| W   | G   | W   | G   |
| Gb1 | B1  | Gb3 | B3  |
| W1  | G   | W3  | G   |
| G   | W2  | G   | W4  |
| R2  | Gr2 | R4  | Gr4 |
| G   | W   | G   | W   |
| W   | G   | W   | G   |
| Gb2 | B2  | Gb4 | B4  |

Fig. 14

| R1 | Gr1 | R3 | Gr3 |
|---|---|---|---|
| G | W | G | W |
| W | G | W | G |
| Gb1 | R' | Gr'3 | B3 |
| W1 | G | W3 | G |
| G | W2 | W' / G | W4 |
| R2 | Gb'2 | B' | Gr4 |
| G | W | G | W |
| W | G | W | G |
| Gb2 | B2 | Gb4 | B4 |

Fig. 15

| R1 | Gr1 | R3 | Gr5 |
| --- | --- | --- | --- |
| G | W | G | W |
| W | Gr2 | W | Gr6 |
| Gb1 | B1 | Gb5 | B3 |
| W1 | Gr3 | W3 | Gr7 |
| Gb2 | W2 | Gb6 | W4 |
| R2 | Gr4 | R4 | Gr8 |
| Gb3 | W | Gb7 | W |
| W | G | W | G |
| Gb4 | B2 | Gb8 | B4 |

Fig. 16

| R1 | Gr1 | R3 | Gr5 |
|---|---|---|---|
| G | W | G | W |
| W | Gr2 | W | Gr6 |
| Gb1 | (R') | (Gr'5) | B3 |
| W1 | Gr3 | W3 | Gr7 |
| Gb2 | W2 (W') | Gb6 | W4 |
| R2 | (Gb'4) | (B') | Gr8 |
| Gb3 | W | Gb7 | W |
| W | G | W | G |
| Gb4 | B2 | Gb8 | B4 |

Fig. 17

| R | G | W | G |
|---|---|---|---|
| G | B | G | W |
| W | G | R | G |
| G | W | G | B |

*Fig. 19*

| R1  | Gr1 | W3 | G  | R3  | Gr3 |
| --- | --- | -- | -- | --- | --- |
| Gb1 | B1  | G  | W4 | Gb3 | B3  |
| W   | G   | R  | Gr | W   | G   |
| G   | W   | Gb | B  | G   | W   |
| R2  | Gr2 | W1 | G  | R4  | Gr4 |
| Gb2 | B2  | G  | W2 | Gb4 | B4  |

Fig. 20

| R1 | Gr1 | W3 | G | R3 | Gr3 |
|----|-----|----|----|----|-----|
| Gb1 | B1 | G | W4 | Gb3 | B3 |
| W | G | R' W' Gr' | W | G |
| G | W | Gb' B' | G | W |
| R2 | Gr2 | W1 | G | R4 | Gr4 |
| Gb2 | B2 | G | W2 | Gb4 | B4 |

Fig. 21

| R1 | Gr1 | W5 | G   | R4  | Gr4 |
|----|-----|----|-----|-----|-----|
| Gb1| B1  | G  | W6  | Gb4 | B4  |
| W1 | G   | R3 | Gr3 | W7  | G   |
| G  | W2  | Gb3| B3  | G   | W8  |
| R2 | Gr2 | W3 | G   | R5  | Gr5 |
| Gb2| B2  | G  | W4  | Gb5 | B5  |

Fig. 22

| R1 | Gr1 | B1 | G | W2 | Gr2 | B2 |
|---|---|---|---|---|---|---|
| Gb1 | | | | | | Gb2 |
| W1 | | | | | | |
| G | | W5 | G | (R') (Gb') | W3 | G |
| | | | | (W') | | |
| R2 | | | | (R') (Gb') | | |
| Gb2 | | G | W6 | (Gr') (B') | G | W4 |
| | | R4 | Gb4 | W7 | G | R5 | Gb5 |
| | | Gr4 | B4 | G | W8 | Gr5 | B5 |

Fig. 23

| R1 | G | W5 | Gr2 | R4 | G |
|----|----|-----|-----|----|----|
| G | B1 | Gb2 | W6 | G | B4 |
| W1 | Gr1 | R3 | Gr3 | W7 | Gr5 |
| Gb1 | W2 | Gb3 | B3 | Gb5 | W8 |
| R2 | G | W3 | Gr4 | R5 | G |
| G | B2 | Gb4 | W4 | G | B5 |

Fig. 24

| R1 | G | W5 | Gr2 | R4 | G |
| G | B1 | Gb2 | W6 | G | B4 |
| W1 | Gr1 | (R') (Gr') | W7 | Gr5 |
| Gb1 | W2 | (Gb')(W')(B') | Gb5 | W8 |
| R2 | G | W3 | Gr4 | R5 | G |
| G | B2 | Gb4 | W4 | G | B5 |

*Fig. 27*

| R1 | Gr1 | R4 | Gr3 |
|---|---|---|---|
| Gb1 | B1 | Gb3 | B4 |
| R2 | W2 | R5 | W4 |
| W1 | B2 | W3 | B5 |
| R3 | Gr2 | R6 | Gr4 |
| Gb2 | B3 | Gb4 | B6 |

*Fig. 28*

| R1 | Gr1 | R4 | Gr3 |
|---|---|---|---|
| Gb1 | B1 | Gb3 | B4 |
| R2 | (R') (W') (Gr') | | W4 |
| W1 | (Gb') (B') | | B5 |
| R3 | Gr2 | R6 | Gr4 |
| Gb2 | B3 | Gb4 | B6 |

*Fig. 33*

| R | G | R | G |
|---|---|---|---|
| G | B | G | B |
| Ye | G | Ye | G |
| G | Ye | G | Ye |
| R | G | R | G |
| G | B | G | B |

*Fig. 34*

| Ye | G | Ye | G |
|---|---|---|---|
| G | Cy | G | Cy |
| W | G | W | G |
| G | W | G | W |
| Ye | G | Ye | G |
| G | Cy | G | Cy |

IMAGING DEVICE AND IMAGING APPARATUS GENERATING IMAGE INFORMATION FOR EACH OF PLURAL PIXELS FROM RECEIVED LIGHT

BACKGROUND

1. Technical Field

The present disclosure relates to an imaging device including several kinds of color filters and an imaging apparatus including the imaging device.

2. Related Art

JP 2010-136225 A describes an imaging device which includes a pixel array part in which pixels are arranged in a two-dimensional matrix with a color for a main component of luminance signal checkered on the matrix and a plurality of colors for color information components arrayed on the remaining portions. JP 2010-136225 A describes the effect that the imaging device converts a signal corresponding to each color of the color array on a color filter part, which is output from each pixel of the pixel array part, into a signal corresponding to the Bayer array and outputs the signal.

SUMMARY

In recent years, digital cameras capable of taking not only a still image but also a moving image by using the same imaging device have been more widely used. In addition, pixels of the imaging device have been made finer so that data of finer image information can be recorded.

Since a still image is taken one by one in principle, a time required for various image process is ensured to some extent. Therefore, even when the highly fine imaging device has increased the amount of information to be processed, the image may be processed in a relatively easy way.

On the other hand, the digital camera takes tens of images per second in shooting a moving image. For example, the digital camera takes sixty images per second. That is, as compared to the case of taking a still image, the amount of information needed to be processed in a unit time is remarkably large in shooting a moving image.

Further, a technique of adding pixels for the fourth color (for example, white) to the pixels of the imaging device (red, green, and blue) is known. That further increases the amount of information to be output from the imaging device.

As described above, the digital camera takes tens of images per second in shooting a moving image. For example, the digital camera takes sixty images per second to obtain a smooth moving image. That is, as compared to the case of taking a still image, the amount of information needed to be processed in a unit time is remarkably large in shooting a moving image. Therefore, the digital camera having the highly fine imaging device needs to be improved in the output from the imaging device so that taking a smooth moving image as well as a still image by using the same imaging device is capable.

The present disclosure concerns an imaging device which can shoot a still image and a moving image and can output a signal more efficiently, and an imaging apparatus including the imaging device.

The imaging apparatus according to the present disclosure includes an imaging device which includes a plurality of pixels and is operable to generate image information for each pixel from received light. Each of the plurality of pixels includes one of first to fourth color filters. Each of the first to fourth color filters has different spectral characteristics. The fourth color filter has the highest light transmittance among the color filters. The first to the fourth color filters are arranged in a specific array. The specific array has first to third centroids which make a Bayer array, the first centroid is a centroid of a plurality of pixels which are used in a first pixel addition process performed on pixel information generated based on lights transmitted through the first color filters, the second centroid is a centroid of a plurality of pixels which are used in a second pixel addition process performed on the pixel information generated based on lights transmitted through the second color filters, and the third centroid is a centroid of a plurality of pixels which are used in a third pixel addition process performed on the pixel information generated based on lights transmitted through the third color filters. Pixel information regarding a color corresponding to the first color filters is generated by the first pixel addition process, pixel information regarding a color corresponding to the second color filters is generated by the second pixel addition process, and pixel information regarding a color corresponding to the third color filters is generated by the third pixel addition process.

The imaging device according to the present disclosure includes a plurality of pixels and is operable to generate image information for each pixel from a received light. Each of the plurality of pixels includes one of first to fourth color filters. Each of the first to the fourth color filters have different spectral characteristics, the fourth color filter has the highest light transmittance among the color filters. The first to the fourth color filters are arranged in a specific array. The specific array has first to third centroids which make a Bayer array, the first centroid is a centroid of a plurality of pixels which are used in a first pixel addition process performed on pixel information generated based on light transmitted through the first color filters, the second centroid is a centroid of a plurality of pixels which are used in a second pixel addition process performed on the pixel information generated based on light transmitted through the second color filters, and the third centroid is a centroid of a plurality of pixels which are used in a third pixel addition process performed on the pixel information generated based on light transmitted through the third color filters. Pixel information regarding a color corresponding to the first color filters is generated by the first pixel addition process, pixel information regarding a color corresponding to the second color filters is generated by the second pixel addition process, and pixel information regarding a color corresponding to the third color filters is generated by the third pixel addition process.

The present disclosure can provide an imaging device and an imaging apparatus which can output image information more efficiently.

BRIEF DESCRIPTION OF DRAWINGS

FIG. 7 is a diagram for describing pixel addition in the first embodiment.

FIG. 8 is a diagram illustrating positions of the respective pixels resulting from the pixel addition in the first embodiment.

FIG. 11 is a diagram illustrating a basic array of color filters in a third embodiment.

FIG. 13 is a diagram for describing the pixel addition in the third embodiment.

FIG. 14 is a diagram illustrating positions of the respective pixels resulting from the pixel addition in the third embodiment.

FIG. 15 is a diagram for describing the pixel addition in a fourth embodiment.

FIG. 16 is a diagram illustrating positions of the respective pixels resulting from the pixel addition in the fourth embodiment.

FIG. 17 is a diagram illustrating a basic array of color filters in a fifth embodiment.

FIG. 19 is a diagram for describing the pixel addition in the fifth embodiment.

FIG. 20 is a diagram illustrating positions of the respective pixels resulting from the pixel addition in the fifth embodiment.

FIG. 21 is a diagram for describing the pixel addition in a sixth embodiment.

FIG. 22 is a diagram illustrating positions of the respective pixels resulting from the pixel addition in the sixth embodiment.

FIG. 23 is a diagram for describing the pixel addition in a seventh embodiment.

FIG. 24 is a diagram illustrating positions of the respective pixels resulting from the pixel addition in the seventh embodiment.

FIG. 27 is a diagram for describing the pixel addition in the eighth embodiment.

FIG. 28 is a diagram illustrating positions of the respective pixels resulting from the pixel addition in the eighth embodiment.

FIG. 33 is a diagram illustrating an array of color filters in an eleventh embodiment.

FIG. 34 is a diagram illustrating an array of color filters in a twelfth embodiment.

DETAILED DESCRIPTION OF PREFERRED EMBODIMENTS

1. First Embodiment

The first embodiment will be described below with reference to the attached drawings. A video camera will be taken as an example of the embodiment.

1-1. Overview

The video camera of the present embodiment is capable of taking a still image and a moving image by using the same imaging device (a CMOS image sensor in the present embodiment). Further, color filters of the CMOS image sensor installed in the video camera according to the present embodiment are arrayed to be able to output signals corresponding to the Bayer array after four kinds of pixels are mixed. That filter array enables the video camera to output image information more efficiently both in shooting a still image and in shooting a moving image by using the same imaging device.

The configuration and the operation of the video camera according to the present embodiment will be described below with reference to the drawings.

1-2. Configuration of Video Camera

Figure 1:
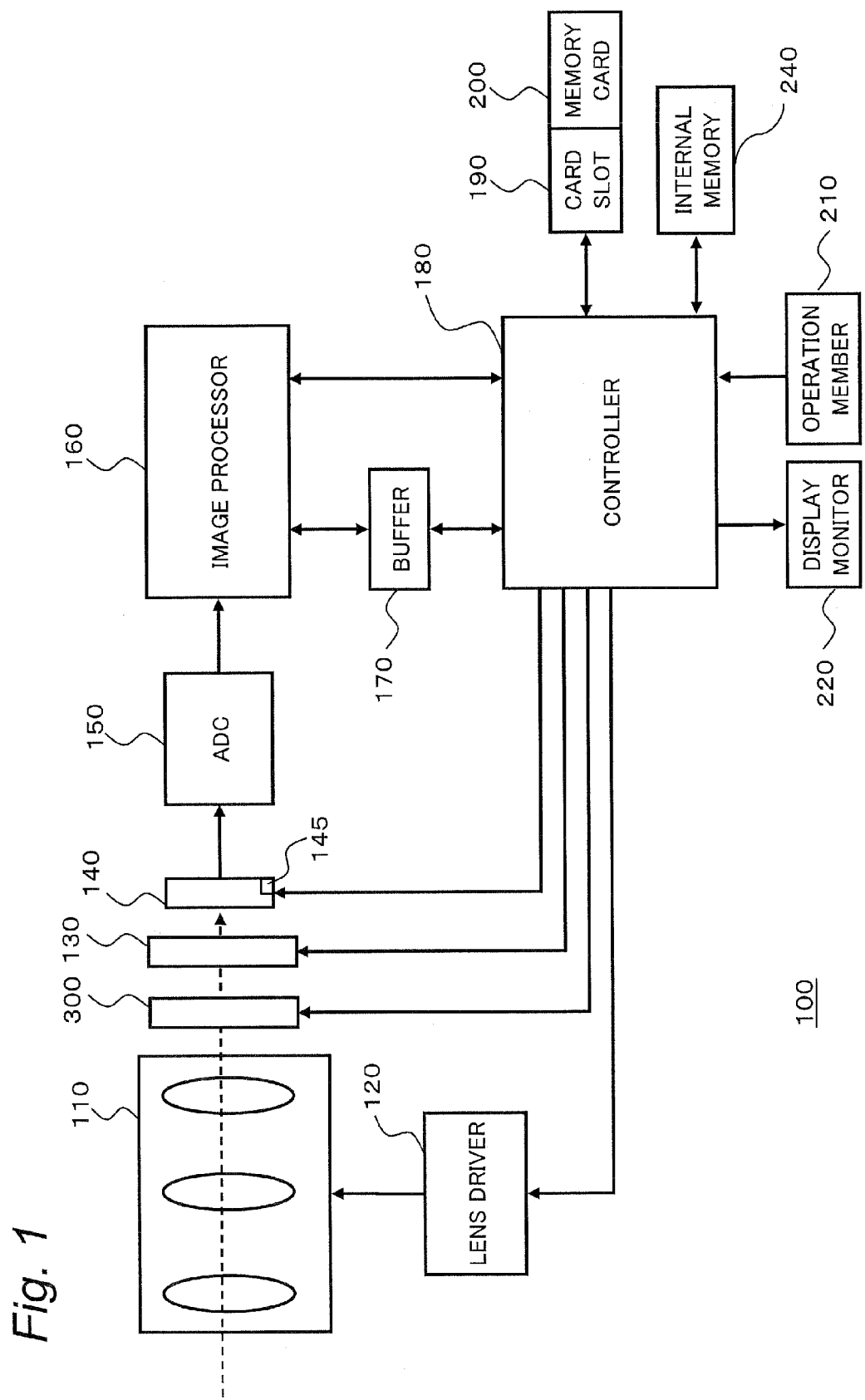
FIG. 1 is a block diagram illustrating a configuration of a video camera according to a first embodiment.

The electrical configuration of the video camera according to the first embodiment will be described with reference to FIG. 1. FIG. 1 is a block diagram illustrating a configuration of the video camera.

The video camera 100 includes an optical system 110, a diaphragm 300, a shutter 130, a CMOS image sensor 140, an A/D converter 150, an image processor 160, a buffer 170, a controller 180, a card slot 190 capable of inserting a memory card 200, a lens driver 120, an internal memory 240, an operation member 210, and a display monitor 220.

The video camera 100 captures a subject image formed through the optical system 110, which includes one or more lenses, by the CMOS image sensor 140. The image data generated by the CMOS image sensor 140 is subject to various image processes by the image processor 160 and stored in the memory card 200. The configuration of the video camera 100 will be described in detail below.

The optical system 110 includes a zoom lens and/or a focus lens. The optical system 110 can enlarge and reduce the subject image by moving the zoom lens along an optical axis. The optical system 110 can also adjust the focus on the subject by moving the focus lens along the optical axis.

The lens driver 120 drives the respective lenses included in the optical system 110. The lens driver 120 includes, for example, a zoom motor for driving the zoom lens and a focus motor for driving the focus lens.

The diaphragm 300 adjusts the size of the aperture to adjust the amount of incoming light onto the CMOS image sensor 140 automatically or according to the setup made by a user.

The shutter 130 is means for shutting off the light to reach the CMOS image sensor 140.

The CMOS image sensor 140 captures the subject image formed through the optical system 110 to generate image data. The CMOS image sensor 140 performs various operations on exposure, transfer, electronic shutter, and/or the like. The CMOS image sensor 140 has pixels with photodiodes corresponding to the respective pixels provided on it. That is, the CMOS image sensor 140 has many photodiodes in a two-dimensional array on its light receptor surface.

The CMOS image sensor 140 also has respective color filters arranged in a predetermined array correspondingly to the pixels. Four kinds of color filters are used in the present embodiment. One of the four kinds of color filters is arranged with respect to each pixel. Each pixel receives the light transmitted the corresponding color filter to output a signal (image information) according to the intensity of the received light. The color filters of the CMOS image sensor 140 will be described in detail later.

The CMOS image sensor 140 also has an adder 145 therein. The adder 145 performs "pixel addition" to output the signal obtained by the addition. Herein, the "pixel addition" refers to generation of a single signal (image information) by adding signals output from plural pixels of the CMOS image sensor 140. Details of the pixel addition will be described later.

The A/D converter (ADC) 150 converts analog image data generated by the CMOS image sensor 140 into digital image data.

The image processor 160 performs operations including generation of image data to be displayed on the display monitor 220 and generation of image data to be stored in the memory card 200, by performing the various processes on the image data generated by the CMOS image sensor 140. For example, the image processor 160 performs the various processes such as gamma correction, white balance correction, and blemish correction on the image data generated by the CMOS image sensor 140. Also, the image processor 160 compresses the image data generated by the CMOS image sensor 140 in the form compliant with H.264 standard, MPEG2 standard, or the like. The image processor 160 can be implemented with a DSP, a microcontroller, or the like.

The controller 180 is a control device for controlling over the whole video camera 100. The controller 180 may be implemented with a semiconductor device or the like. The controller 180 may be configured of hardware alone or may be implemented with a combination of hardware and software. The controller 180 may be implemented by a microcontroller or the like.

The buffer 170 functions as a working memory for the image processor 160 and the controller 180. The buffer 170 may be implemented with a DRAM, a ferroelectric memory, or the like.

The card slot 190 can store the memory card 200. The card slot 190 can also be connected to the memory card 200 electrically and mechanically. The memory card 200 has a flash memory, a ferroelectric memory, or the like therein and can store data including an image file generated by the image processor 160.

The internal memory 240 includes a flash memory, a ferroelectric memory, and/or the like. The internal memory 240 stores programs such as, for example, a control program for controlling over the whole video camera 100.

The operation member 210 includes a user interface for receiving a user's operation. The operation member 210 includes, for example, directional keys and an OK button for receiving a user's operation, an operation button for switching modes, a button for instructing to shoot a still image, a button for instructing to shoot a moving image, and the like.

The display monitor 220 can display an image (through image) indicated by the image data generated in the CMOS image sensor 140 and an image indicated by the image data read out from the memory card 200. The display monitor 220 can also display various menu screens and the like for inputting various settings for the video camera 100.

1-3. Color Filter Array on CMOS Image Sensor

The color filters on the CMOS image sensor 140 according to the present embodiment will be described in detail below. The CMOS image sensor 140 has four kinds of color filters such as a red filter, a green filter, a blue filter, and a white filter. Hereinafter, the red filter, the green filter, the blue filter, and the white filter will be respectively referred to as "R filter", "G filter". "B filter", and "W filter".

Figure 2:
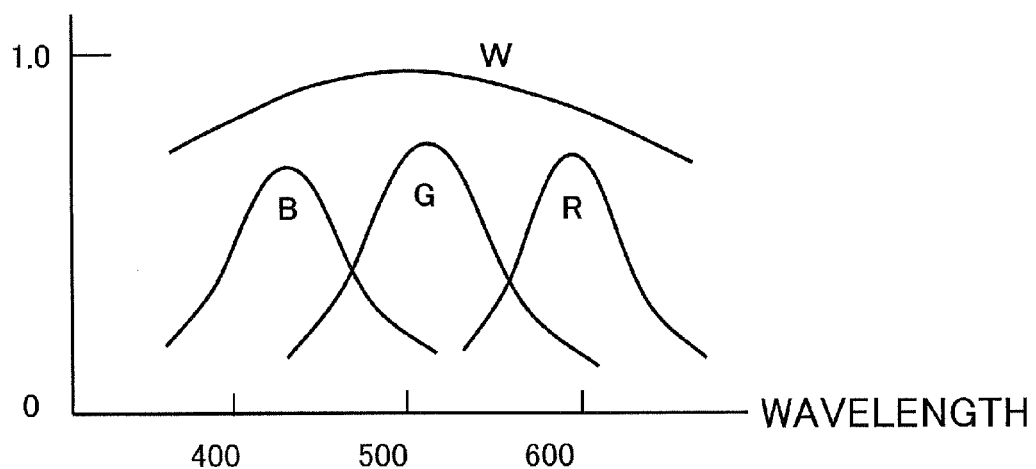
FIG. 2 is a diagram illustrating spectral sensitivity features of four kinds of color filters (R, G, B, and W).

FIG. 2 is a diagram illustrating spectral sensitivity features of the respective kinds of color filters. As illustrated in FIG. 2, the R filter has a feature of transmitting red colored (R) light, the G filter has a feature of transmitting green colored (G) light, and the B filter has a feature of transmitting blue colored (B) light. The W filter has a feature of having higher light transmittance than that of the G filter which has the highest light transmittance out of the R filer, the G filter, and the B filter, and also has a feature of transmitting light of the all wavelength ranges.

Figure 3:
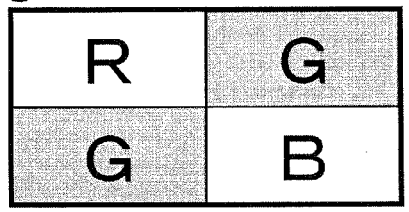
FIG. 3 is a diagram illustrating the Bayer array that is a general pixel array.
Figure 4:
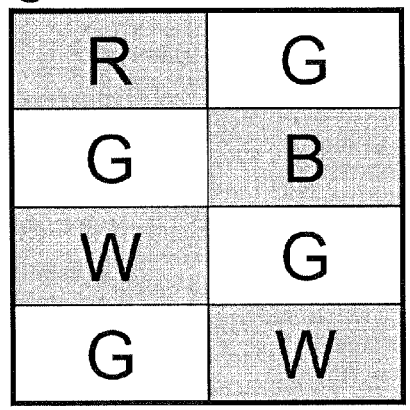
FIG. 4 is a diagram illustrating a basic array of color filters in a CMOS image sensor according to the first embodiment.

The color filter array on the CMOS image sensor 140 with the above described four kinds of color filters will be described below. Hereinafter, the color filter array will also be referred to as pixel array. FIG. 3 is a diagram illustrating a basic array of the Bayer array which is a general pixel array. FIG. 4 is a diagram illustrating a basic array of pixels in the CMOS image sensor 140 according to the present embodiment. The "basic array" is the base unit of array in the pixel array according to the present embodiment.

In the Bayer array, the three kinds of color filters such as the R filter, the G filter, and the B filter are arrayed to repeat the basic array illustrated in FIG. 3. In the Bayer array, the G filters are checkered with the R filters and the B filters arrayed adjacent to the G filters alone.

Unlike the Bayer array, the basic array of pixels in the CMOS image sensor 140 includes the four kinds of color filters such as the R filter, the G filter, the B filter, and the W filter as illustrated in FIG. 4. The basic array of the pixel array in the present embodiment is the array with four rows and two columns.

In the CMOS image sensor 140 according to the present embodiment, the G filters, which have high contribution ratio to the luminance signal, are checkered as the G filter The arrangement of checkered G filters can ensure the same luminance resolution as that of the Bayer array illustrated in FIG. 3.

Figure 5:
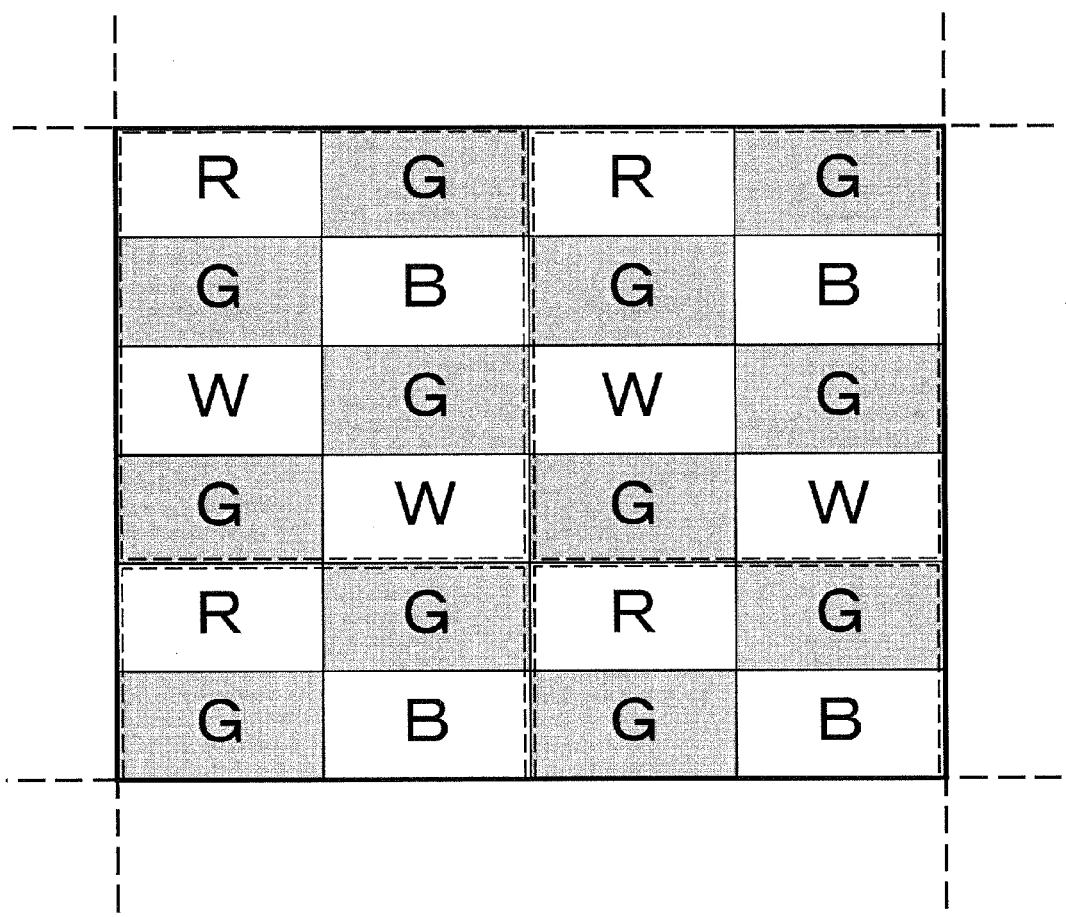
FIG. 5 is a diagram illustrating a pixel array in the CMOS image sensor according to the first embodiment.

FIG. 5 is a diagram illustrating the pixel array including the basic arrays illustrated in FIG. 4 repeated horizontally and vertically. FIG. 5 illustrates the array with four columns and six rows, which is a part of the repeated pixel array. In fact, the pixels are arranged continuously below, above, on the right, and on the left of the matrix illustrated in FIG. 5. For example, the G filter and the W filter are arrayed above the upper left eight filters and above the upper right six filters shown in FIG. 5 according to the basic array, though, these filters are omitted in the drawing for convenience of explanation. Similarly, the W filter and the G filter are arranged below the lower left four filters and below the lower right four filters in FIG. 5 according to the basic array, though, these filters are omitted in the drawing.

1-4. Operation of Video Camera

The operations of the video camera 100 according to the present embodiment will be described below. The operations of the CMOS image sensor 140 installed in the video camera 100 will be described below as well.

Figure 6:
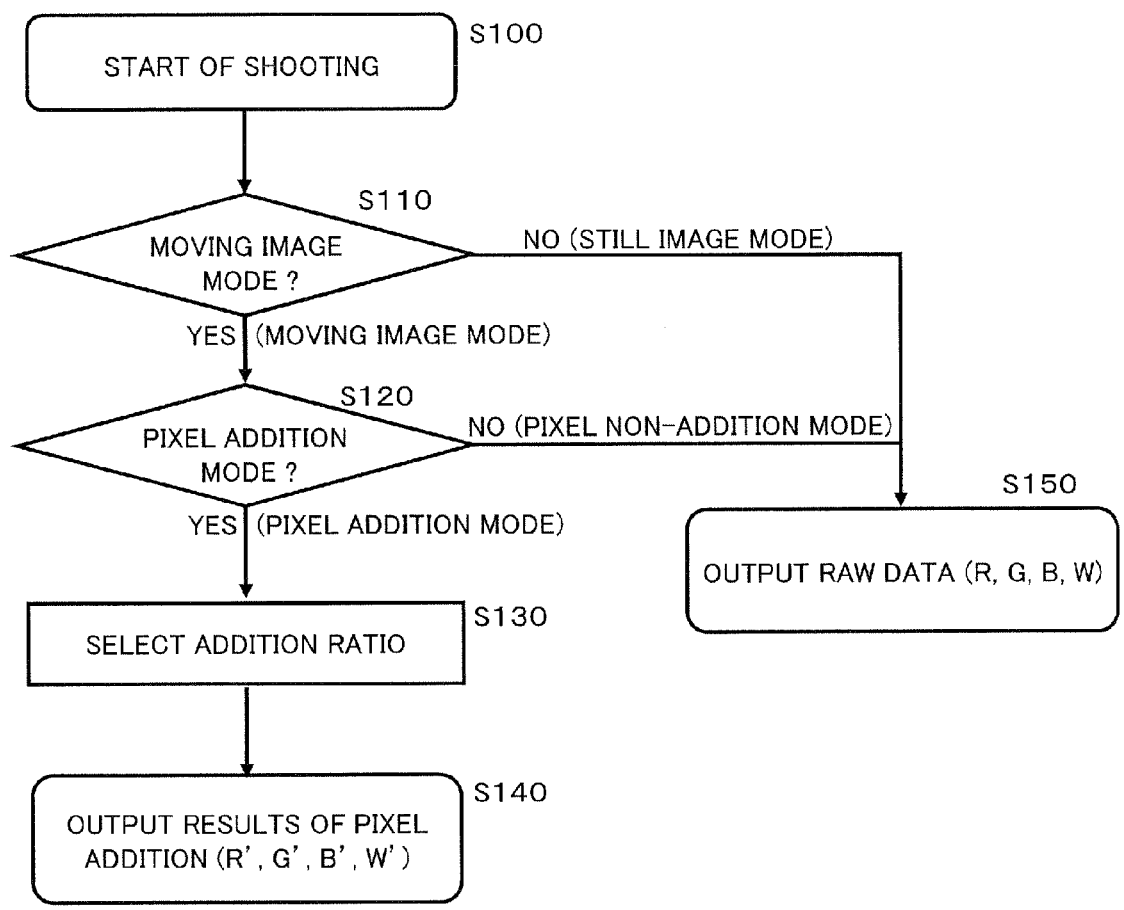
FIG. 6 is a flowchart describing operations of the video camera according to the first embodiment.

FIG. 6 is a flowchart describing the operations of the video camera 100 according to the present embodiment. When the power supply of the video camera 100 is switched ON, the controller 180 supplies power to the respective units of the video camera 100. As a result, the respective lenses included in the optical system 110, the CMOS image sensor 140, and the like can perform initial setting. When the optical system 110, the CMOS image sensor 140, and the like finish the initial setting, the video camera 100 becomes able to shoot a picture.

The video camera 100 has two modes such as the shooting mode and the playback mode. The operations of the video camera 100 in the playback mode will be omitted. When the video camera 100 becomes able to shoot a picture with the shooting mode set, the display monitor 220 starts to display the through image captured by the CMOS image sensor 140 and processed by the image processor 160.

While the display monitor 220 is displaying the through image, the controller 180 monitors whether the instruction button of taking a still image is pressed and whether the instruction button of taking a moving image is pressed. According to press of any instruction button, the controller 180 starts to shoot in the instructed mode (S100). That is, when the instruction button of taking a still image is pressed, the controller 180 sets the operation mode to the still image mode. When the instruction button of taking a moving image is pressed, the controller 180 sets the operation mode to the moving image mode.

The CMOS image sensor 140 of the video camera 100 according to the present embodiment switches the output mode for the image data according to the set operation mode (still image mode/moving image mode) (S110).

Specifically, when the operation mode is set to the still image mode (No in step S110), the CMOS image sensor 140 outputs RAW data which configured by the signals output from all the pixels (S150) without causing the adder 145 to perform the pixel addition on the output from each pixel. Thereby, when the still image mode is set, the video camera 100 can output highly fine image data.

Herein, the video camera 100 according to the present embodiment has two output modes in the moving image mode: a pixel addition mode for the adder 145 of the CMOS image sensor 140 to perform the pixel addition on the output signal from each pixel, and a pixel non-addition mode for the adder 145 not to perform the pixel addition. The user can previously select either of the pixel addition mode and the pixel non-addition mode. In the moving image mode, the adder 145 of the CMOS image sensor 140 switches the output mode for the image data according to the previously selected output mode (pixel addition mode/pixel non-addition mode) (S120).

Specifically, when the moving image mode is selected as the operation mode (Yes in step S110), the adder 145 determines whether the output mode is set to the pixel addition mode (S120).

When the pixel non-addition mode is set (No in step S120), the CMOS image sensor 140 outputs RAW data which configured by the output signals from all the pixels without performing the pixel addition on the output signal from each pixel (S150). Hereinafter, the pixels for which the R filter, the G filter, the B filter, and the W filter are provided will be respectively referred to as "pixel R", "pixel G", "pixel B", and "pixel W".

For example, when it is desired to output highly fine image data even with the frame rate lowered to some extent in shooting the moving image or when the moving image and the still image are obtained at the same time, it is effective to output RAW data from all the pixels without performing the pixel addition.

On the other hand, when the pixel addition mode is set (Yes in step S120), the CMOS image sensor 140 selects the ratio in adding the output signals from the respective pixels (R, G, B, and W) in the pixel addition (S130).

Note that the video camera 100 may not be configured to select the ratio in the pixel addition. In that case, a predetermined addition ratio may be previously set.

The adder 145 of the CMOS image sensor 140 performs the pixel addition process on the output signals from the respective pixels (R, G, B, and W) according to the selected addition ratio. Then, the adder 145 outputs the signal resulting from the pixel addition (S140). Hereinafter, the output signals from the pixels R, G, B, and W will be respectively referred to as "signal R", "signal G", "signal B", and "signal W".

It is effective to perform the pixel addition on the output signals R, G, B, and W from the respective pixels R, G, B, and W in the above manner when, for example, it is desired to obtain a smooth image by raising the frame rate in shooting a moving image or it is desired to improve the S/N under low illumination intensity.

1-5. Pixel Addition Operation

The pixel addition operation performed by the CMOS image sensor 140 will be described in detail below.

FIG. 7 is a diagram for describing the pixel addition operation in the present embodiment. Note that, in the pixel array illustrated in FIG. 7, the pixel G horizontally adjacent to the pixel R will be referred to as "pixel Gr", and the pixel G horizontally adjacent to the pixel B will be referred to as "pixel Gb". The pixel addition operation is performed in unit of the pixel array with six rows and four columns illustrated in FIG. 7.

The CMOS image sensor 140 performs the operation by using the expression 1 below on the output signals (R, Gr, Gb, B, and W) from the respective pixels (R, Gr, Gb, B, and W) to generate the added signals (R', Gr', Gb', 13', and W'). For example, The CMOS image sensor 140 adds a plurality of signals Rs (R1 to R4) output from a plurality of pixels Rs (R1 to R4) to generate a signal R'.

$$R'=(R1+R2+R3+R4)/4$$

$$B'=(B1+B2+B3+B4)/4$$

$$Gr'=(Gr1+Gr2+Gr3+Gr4)/4$$

$$Gb'=(Gb1+Gb2+Gb3+Gb4)/4$$

$$W'=(W1+W2+W3+W4)/4 \qquad \text{(Expression 1)}$$

FIG. 8 is a diagram illustrating positions of the respective pixels (R', Gr', Gb', B', and W') resulting from the pixel addition process based on the expression 1. The positions R', Gr', Gb', B' and W' indicate the centroids of the plurality of pixels R, Gr, Gb, B, and W, respectively. For example, the position R' in FIG. 8 indicates the centroid of the plurality of pixels Rs (R1 to R4). That is the case for the other positions Gr', Gb', B', and W'.

The adder 145 performs the pixel addition on the each of signals (R, Gr, Gb, B, and W) to output the respective signals (R', Gr', Gb', B', and W') resulting from the pixel addition to the ADC 150. In this time, the each of signals R', Gr', Gb', B', and W' is output deemed a signal generated at the respective centroids of a plurality of pixels used for the pixel addition. For example, the signal R' is output deemed a signal generated at the centroid of a plurality of pixels Rs (R1 to R4).

As illustrated in FIG. 8, the array of the centroids of the plurality of pixels (R, Gr, Gb, and B) are the same as the Bayer array (FIG. 3), respectively. That is, the adder 145 outputs the signals (R', Gr', Gb', and B') resulting from the pixel addition in the Bayer array pattern.

That is, in the present embodiment, the CMOS image sensor 140 has the color filters (R, G, B, and W) arranged to output the result of the pixel addition process in the Bayer array pattern.

Since the signals (R', Gr', Gb', and B') are output in the Bayer array pattern as described above, the present embodiment is advantageous in that conventional processing devices supporting the Bayer array pattern are available as processing devices in the latter stage.

The adder 145 also adds signals Ws output from a plurality of pixels Ws (W1 to W4) to output the signals W's. In this time, the signal W' is output deemed a signal generated at the centroid (the position W' in FIG. 8) of a plurality of pixels Ws (W1 to W4). As illustrated in FIG. 8, the centroid W' of the plurality of pixels Ws (W1 to W4) matches the centroid of the positions R', Gr', Gb', and B'. That is, the output position W' for the signal W' is in the center of the Bayer array, thus the probability of errors caused by the deviation of the centroid such as a false color is low even during signal process performed with the signals R', Gr', Gb', B', and W'.

1-6. Operation of Image Processor 1-6-1. Signal Processing in Pixel Addition Mode As described with reference to FIG. 6, in the pixel addition mode selected, the CMOS image sensor 140 outputs the signals R', Gr', Gb', B', and W' which are generated by the pixel addition.

The signal processing performed by the image processor 160 when the CMOS image sensor 140 outputs the signals R', Gr', Gb', B', and W' which are generated by the pixel addition will be described below.

The image processor 160 generates the luminance signal based on the signals R', Gr', Gb', B', and W' output from the CMOS image sensor 140.

Specifically, the image processor 160 generates the low frequency component YL of the luminance signal from R'L, Gr'L, Gb'L, and B'L which are the low frequency components of the signals R', Gr', Gb', and B' respectively by using the expression 2 below. The respective constants in the expression 2 are the coefficients defined in the standard specification of BTA S-001C.

$$YL = 0.213*R'L + 0.715*(Gr'L + Gb'L)/2 + 0.072*B'L \quad \text{(Expression 2)}$$

Note that the low frequency component YL may be generated based on the expression 3 below. Herein, the coefficients for the low frequency components R'L, Gr'L, Gb'L, and B'L in the expression 3 are valid coefficients for suppressing the moire which might occur when an achromatic subject is captured.

$$YL = 0.25*R'L + 0.5*(Gr'L + Gb'L)/2 + 0.25*B'L \quad \text{(Expression 3)}$$

Also, the image processor 160 finds the high frequency component YH of the luminance signal from the high frequency components Gr'H, Gb'H which are the high frequency components of the signal Gr', the signal Gb' respectively by using the expression 4 below.

$$YH = (Gr'H + Gb'H)/2 \quad \text{(Expression 4)}$$

Then, the image processor 160 generates the luminance signal Y by performing the operation with the expression 5 below.

$$Y = YH + YL + m*W'L, 0 \leq m \quad \text{(Expression 5)}$$

Specifically, the image processor 160 composes the luminance signal Y by adding the low frequency component W'L of the signal W' multiplied by the coefficient m to the found low frequency component YL plus the found high frequency component YH. The coefficient m may be set by the controller 180 according to the level of the illumination intensity or the aperture value of the lens, for example.

Note that the signal W has all the components R, G, and B, the components R and B in the signal W' (R" and B") may be generated by the operation with the expression 6 below. That is, the components R and B in the signal W' (R" and B") can be calculated by subtracting the signal R', the signal B', the signal Gr', and the signal Gb' from the signal W' which are generated by the pixel addition.

$$R''L = W'L - (Gr'L + Gb'L)/2 - B'L$$

$$B''L = W'L - (Gr'L + Gb'L)/2 - R'L \quad \text{(Expression 6)}$$

The image processor 160 may use, as chrominance signals, the found signals R" and B" added with the signals R' and B'.

1-6-2. Signal Processing in Pixel Non-Addition Mode

The signal processing in the image processor 160 in the pixel non-addition mode selected will be described with reference to the pixel array illustrated in FIG. 5. As described above, FIG. 5 is a diagram illustrating the array of pixels in the CMOS image sensor 140 according to the present embodiment.

As illustrated in FIG. 5, since the pixels Gs are checkered as in the Bayer array (FIG. 3), high resolution can be expected for the luminance signal based on the high frequency component GH of the output signal G from the pixel G.

Furthermore, as in the case of the pixel addition, addition of the signal W to the low frequency component YL of the luminance signal can improve the sensitivity and the S/N.

Note that the low frequency component WL of the signal W may be multiplied by the coefficient m and added to the YL component. At this time, the coefficient m is adjusted by the controller 180 according to the image sensing conditions.

The expression 7 below corresponds to the above described operation. The luminance signal Y is composed by adding the high frequency component YH of the luminance signal Y to the low frequency component YL of the luminance signal Y.

$$YL = 0.213*RL + 0.715*GL + 0.072*BL + m*WL$$

$$YH = GH$$

$$Y = YH + YL$$

$$m \geq 0 \quad \text{(Expression 7)}$$

1-7. Conclusion of Present Embodiment

The video camera 100 according to the present embodiment includes a CMOS image sensor 140 which includes a plurality of pixels and is operable to generate image information for each pixel from received light. Each of the plurality of pixels includes one of R filter, B filter, G filter, and W filter. Each of the R filter, B filter, G filter, and W filter has different spectral characteristics. The W filter has the highest light transmittance among the color filters. The R filter, B filter, G filter, and W filter are arranged in a specific array. The specific array has first to third centroids R', B', and G' which make a Bayer array, the first centroid R' is a centroid of a plurality of pixels Rs which are used in a first pixel addition process performed on pixel information generated based on lights transmitted through the R filters, the second centroid B' is a centroid of a plurality of pixels Bs which are used in a second pixel addition process performed on the pixel information generated based on lights transmitted through the B filters, and the third centroid G' is a centroid of a plurality of pixels Gs which are used in a third pixel addition process performed on the pixel information generated based on lights transmitted through the G filters. Pixel information regarding a color corresponding to the R filter is generated by the first pixel addition process, pixel information regarding a color corresponding to the B filter is generated by the second pixel addition process, and pixel information regarding a color corresponding to the G filter is generated by the third pixel addition process.

The video camera 100 with the above described configuration adds up the respective signals Rs, Bs, and Gs output from the plurality of pixels Rs, Bs, and Gs to generate a single corresponding signal R', a single corresponding signal B', and a single corresponding signal G'. Then, the video camera 100 outputs the generated signals R', B', and G' in the Bayer array. As a result, the video camera 100 can output the signals (image information) more efficiently.

2. Second Embodiment

The second embodiment will be described below.

The configuration and the operation of the video camera 100 according to the present embodiment are basically the same as those of the video camera 100 of the first embodiment. However, the method of adding pixels according to the present embodiment differs from that of the first embodiment.

Figure 9:
FIG. 9 is a diagram for describing the pixel addition in a second embodiment.

FIG. 9 is a diagram for describing the pixel addition in the present embodiment. The filter array according to the present embodiment is the same as that of the first embodiment.

In the first embodiment (FIG. 7), four pixels are added up for each of the pixels Grs and Gbs. Unlike that, in the present embodiment, six pixels are added up for each of the pixels Grs and Gbs. As for the pixels of the other colors (R, B, and W), four pixels are added up as in the first embodiment.

Specifically, the adder 145 of the CMOS image sensor 140 performs the operation with the expression 8 below on the output signals from the respective pixels.

$R'=(R1+R2+R3+R4)/4$ $B'=(B1+B2+B3+B4)/4$ $Gr'=(Gr1+Gr2+Gr3+Gr4+Gr5+Gr6)/6$ $Gb'=(Gb1+Gb2+Gb3+Gb4+Gb5+Gb6)/6$ $W'=(W1+W2+W3+W4)/4$      (Expression 8)

Figure 10:
FIG. 10 is a diagram illustrating positions of the respective pixels resulting from the pixel addition in the second embodiment.

FIG. 10 is a diagram illustrating positions of the respective pixels R', Gr', Gb', B', and W' resulting from the pixel addition process using the expression 8. For example, the position Gr' indicates the centroid of the plurality of pixels Grs (Gr1 to Gr6). The adder 145 generates the signal Gr' by adding up a plurality of signals Grs (Gr1 to Gr6) and outputs the signal Gr' deemed a signal generated at the position Gr'. That is the case for the signals of the other colors R, Gb, B, and W.

Also when the operation is performed using the expression 8, the array of the positions of the signals R', Gr', Gb', and B' resulting from the pixel addition process is the same as the Bayer array as illustrated in FIG. 10. In the present embodiment, the CMOS image sensor 140 has the color filters R, G, B, and W arranged to output the result of the pixel addition process in the Bayer array pattern.

Thereby, the adder 145 can output the signal (image information) more efficiently as in the first embodiment.

Further, as illustrated in FIG. 10, the adder 145 generates and outputs the signal W' resulting from the pixel addition so that the signal W' is placed at the center of the Bayer array (R', Gr', Gb', and B). That makes the probability of errors caused by the deviation of the centroid such as a false color low even during signal processing performed with the signals R', Gr', Gb', B', and W' as in the first embodiment.

Further, as the number of pixels to be added up increases, the effect of noise reduction rises.

3. Third Embodiment

The third embodiment will be described below with reference to FIG. 11 to FIG. 14.

The basic array of the present embodiment differs from that of the first embodiment (FIG. 4). Accordingly, the positions of the pixels to be subject to the pixel addition differ from those of the first embodiment. The configuration and the operation of the video camera 100 except for the above described points are the same as those of the first embodiment.

Figure 11:
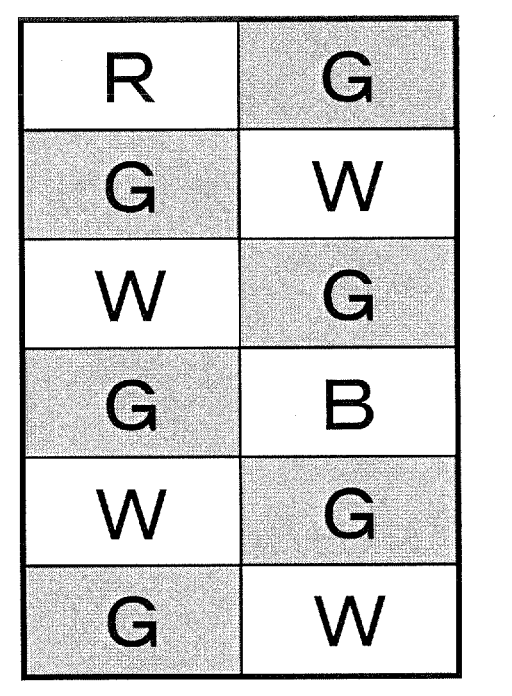

FIG. 11 is a diagram illustrating a basic array of pixels in the present embodiment.

As illustrated in FIG. 11, the basic array of color filters in the present embodiment is the array with six rows and two columns. Also in the basic array according to the present embodiment, four kinds of color filters (R, G, B, and W) are arrayed and the G filters are checkered as in the basic array of the first embodiment (FIG. 4).

Figure 12:
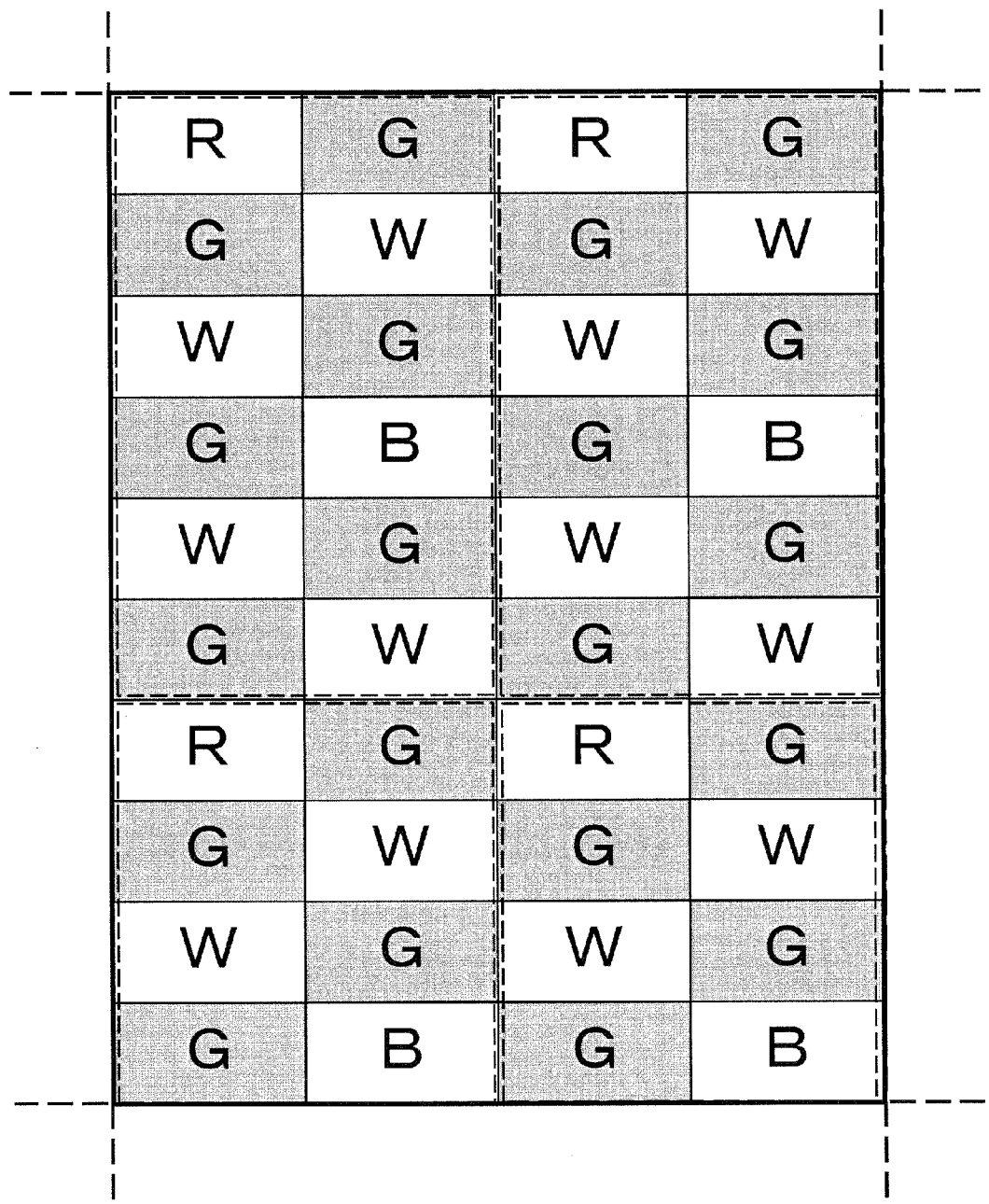
FIG. 12 is a diagram illustrating a pixel array in a CMOS image sensor according to the third embodiment.

FIG. 12 is a diagram illustrating the pixel array including the basic array according to the present embodiment illustrated in FIG. 11 repeated horizontally and vertically. On the practical CMOS image sensor 140, the pixel G and the pixel W are arrayed above the upper left twelve filters and above the upper right twelve filters in FIG. 12 according to the basic array, though, the array with ten rows and four columns, which is a part of the arrayed pixels, is illustrated in FIG. 12 for convenience of explanation. Similarly, the pixel W and G are arrayed below the lower left four filters and below the lower right four filters in FIG. 12 according to the basic array, though, these pixels are omitted in the drawing.

FIG. 13 is a diagram for describing the pixel addition in the present embodiment. In FIG. 13, the pixel G adjacent to the pixel R is represented by "pixel Gr", and the pixel G adjacent to the pixel B is represented by "pixel Gb". Further, as for the pixel W, the four pixels Ws to be added up are represented by the pixels W1 to W4.

The adder 145 of the CMOS image sensor 140 performs the operation with the expression 1, which has been described in the first embodiment, on the output from the respective pixels of the above described array.

FIG. 14 is a diagram illustrating positions of the respective pixels R', Gr', Gb', B', and W' resulting from the pixel addition according to the present embodiment. For example, the position R' indicates the centroid of the plurality of pixels Rs (only the pixels represented by Rs with indices). That is the case for the pixels of the other colors Gr, Gb, B, and W. As illustrated in FIG. 14, in the present embodiment, the pixels W1 to W4, which are in the neighbor to the centroid W' of the pixels Ws, are subject to the pixel addition on the pixels Ws.

As illustrated in FIG. 14, the array of the centroids R', Gr', Gb', and B' of the plurality of pixels Rs, Grs, Gbs, and Bs, which are subject to the pixel addition process, are the same as the Bayer array (FIG. 3). In the present embodiment, the CMOS image sensor 140 has the color filters (R, G, B, and W) arranged to output the result of the pixel addition process in the Bayer array pattern.

Further, as illustrated in FIG. 14, the signal W' resulting from the pixel addition is output deemed a signal generated at the centroid W' of a plurality of pixels Ws. Since the position W° is placed in the center of the Bayer array (R', Gr', Gb', and B'), the probability of errors caused by the deviation of the centroid such as a false color is low even during signal processing performed with the signals R', Gr', Gb', B', and W' as in the first embodiment.

4. Fourth Embodiment

The fourth embodiment will be described with reference to FIG. 15 to FIG. 16. Although the pixel array in the present embodiment is the same as that of the third embodiment, the number of the pixels to be subject to the pixel addition differs from that of the third embodiment. The configuration and the operation of the video camera 100 except for the above described point are the same as those of the third embodiment.

In the third embodiment (FIG. 13), four pixels are added up for each of the pixels Grs and Gbs. However, the numbers of the respective pixels Grs and Gbs to be added up may be other than four as in the second embodiment (FIG. 9). The adder 145 according to the present embodiment adds up eight pixels for each of the pixels Grs and Gbs.

FIG. 15 is a diagram for describing the pixel addition in the present embodiment. The adder 145 according to the present embodiment generates a single signal Gr' by adding up output signals Gr1 to Gr8 from a plurality of pixels Gr1 to Gr8, and generates a single signal Gb' by adding up output signals Gb1 to Gb8 from a plurality of pixels Gb1 to Gb8. The operations for the pixels of the other colors (R, B, and W) are the same as those in the third embodiment.

Specifically, the adder 145 performs the operation with the expression 9 below.

$$R'=(R1+R2+R3+R4)/4$$

$$B'=(B1+B2+B3+B4)/4$$

$$Gr'=(Gr1+Gr2+Gr3+Gr4+Gr5+Gr6+Gr7+Gr8)/8$$

$$Gb'=(Gb1+Gb2+Gb3+Gb4+Gb5+Gb6+Gb7+Gb8)/8$$

$$W'=(W1+W2+W3+W4)/4 \quad \text{(Expression 9)}$$

FIG. 16 is a diagram illustrating the centroids of the respective pixels in the present embodiment. As illustrated in FIG. 16, the centroids Gr' and Gb' of the plurality of pixels Grs (Gr1 to Gr8) and Gbs (Gb1 to Gb8), which are subject to the pixel addition, are the same as the centroids Gr' and Gb' (FIG. 14) of the plurality of pixels Grs (Gr1 to Gr4) and Gbs (Gb1 to Gb4) in the third embodiment.

The adder 145 according to the present embodiment outputs the signals Gr' and Gb' resulting from the pixel addition deemed signals generated at the centroids Gr' and Gb' of the plurality of pixels Grs and Gbs, respectively.

The pixel addition performed in the above described manner can also provide the same effect as that of the first embodiment.

5. Fifth Embodiment

The fifth embodiment will be described below with reference to FIG. 17 to FIG. 20. The basic array of the pixels according to the present embodiment differs from that of the first embodiment and that of the third embodiment. The configuration and the operation of the video camera 100 except for the above described point are the same as those of the first embodiment.

Figure 17:
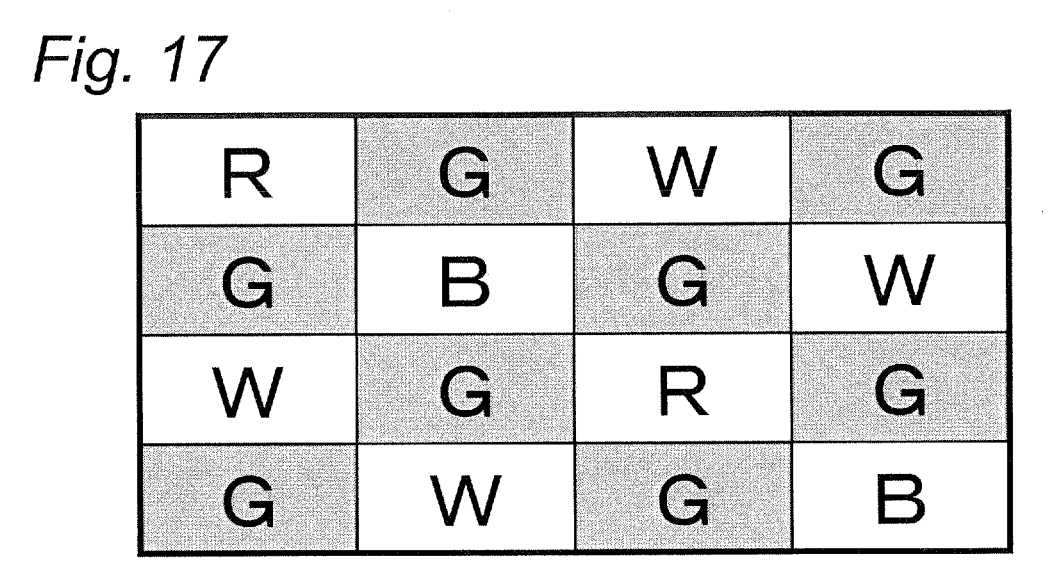

FIG. 17 is a diagram illustrating a basic array of the pixels in the present embodiment. The basic array according to the present embodiment is the array with four rows and four columns. The basic array according to the present embodiment includes four kinds of pixels R, G, B, and W with the pixels Gs checkered as in the above described basic arrays of the first embodiment and the third embodiment.

Figure 18:
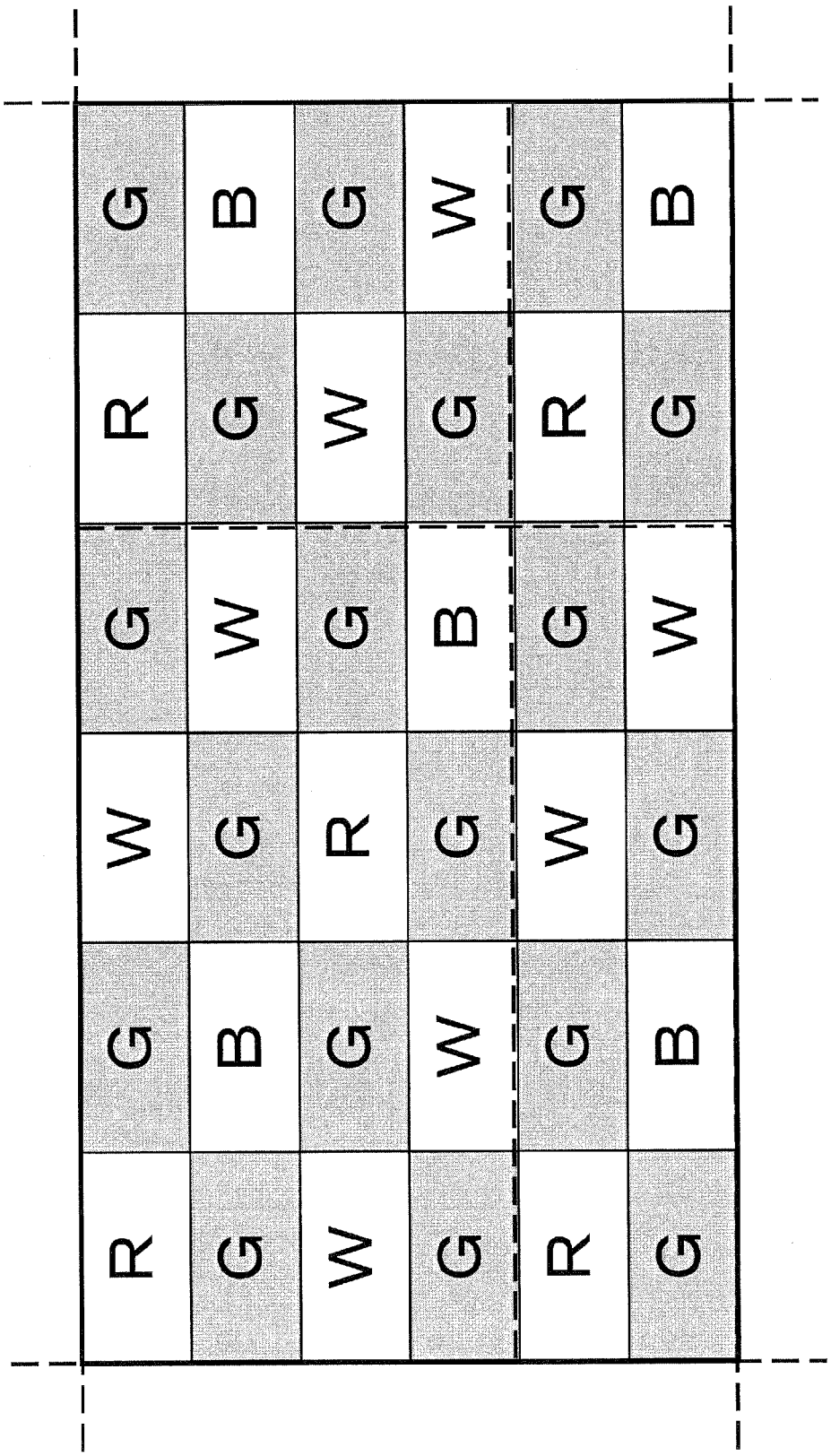
FIG. 18 is a diagram illustrating a pixel array in a CMOS image sensor according to the fifth embodiment.

FIG. 18 is a diagram illustrating the pixel array on the CMOS image sensor 140. As illustrated in FIG. 18, the basic array according to the present embodiment is horizontally and vertically repeated in the CMOS image sensor 140. FIG. 18 illustrates the array with six rows and six columns, which is a part of the pixels arrayed in the CMOS image sensor 140, for convenience of explanation.

FIG. 19 is a diagram for describing the pixel addition in the present embodiment. In FIG. 19, the pixel G adjacent to the pixel R is represented by "pixel Gr", and the pixel G adjacent to the pixel B is represented by "pixel Gb" as in the first embodiment (FIG. 7) and the third embodiment (FIG. 13). As for the pixel W, the four pixels Ws to be subject to the pixel addition are represented by the pixels W1 to W4.

The adder 145 of the CMOS image sensor 140 performs the operation with the expression 1, which has been described in the first embodiment, on the output from the respective pixels.

FIG. 20 is a diagram illustrating positions of the respective pixels (R', Gr', Gb', B', and W') resulting from the pixel addition. For example, the position R' indicates the centroid of the plurality of pixels Rs (R1 to R4). The signal R' is output deemed a signal generated at the position R'. That is the case for the other positions (Gr', Gb', B', and W').

As illustrated in FIG. 20, the array of the output positions R', Gr', Gb', and B' for the signals R', Gr', Gb', and B' resulting from the pixel addition process is the same as the Bayer array (FIG. 3). In the present embodiment, the CMOS image sensor 140 has the color filters (R, G, B, and W) arranged to output the result of the pixel addition process in the Bayer array pattern. Further, the position W' at which the signal W' is output is in the center of the Bayer array as illustrated in FIG. 20, thus the probability of errors caused by the deviation of the centroid such as a false color is low even during signal processing performed with the signals R', Gr', Gb', B', and W' as in the first embodiment.

6. Sixth Embodiment

The sixth embodiment will be described below with reference to FIG. 21 to FIG. 22. The basic array of the present embodiment is the same as that of the fifth embodiment. However, the number of the pixels to be subject to the pixel addition in the present embodiment differs from that of the fifth embodiment.

The increased number of the pixels to be added up enables further improvement of the S/N. Therefore, the pixel to be added up may be increased as in the examples illustrated in the second embodiment (FIG. 9) and the fourth embodiment (FIG. 15).

FIG. 21 is a diagram for describing the pixel addition in the present embodiment. The adder 145 according to the present embodiment adds up the pixels which are more than the pixels for the pixel addition in the fifth embodiment, and adds the pixels R (R3), B (B3), Gr (Gr3), and Gb (Gb3) at the centroids as the objects of the pixel addition. As a result, the adder 145 calculates the average of five pixels as to the pixels R, B, Gr, and Gb, and calculates the average of eight pixels as to the pixel W.

Specifically, the adder 145 of the CMOS image sensor 140 performs the operation with the expression 10 below on the output from the respective pixels.

$$R'=(R1+R2+R3+R4+R5)/5$$

$$B'=(B1+B2+B3+B4+B5)/5$$

$$Gr'=(Gr1+Gr2+Gr3+Gr4+Gr5)/5$$

$$Gb'=(Gb1+Gb2+Gb3+Gb4+Gb5)/5$$

$$W'=(W1+W2+W3+W4+W5+W6+W7+W8)/8 \quad \text{(Expression 10)}$$

FIG. 22 is a diagram illustrating positions of the respective pixels (R', Gb', Gr', B', and W') resulting from the pixel addition in the present embodiment. For example, the position R' indicates the centroid of the plurality of pixels Rs as in FIG. 20. The signal R' is output deemed a signal generated at the position R'. That is the case for the other positions Gb', Gr', B', and W'. As illustrated in FIG. 22, the centroids R', Gb', Gr', B', and W' of the respective pixels of the present embodiment are the same as those of the fifth embodiment (FIG. 20).

The pixel addition performed in the present embodiment can also provide the same effect as that of the first embodiment.

7. Seventh Embodiment

The seventh embodiment will be described below with reference to FIG. 23 to FIG. 24. Unlike the adders 145 according to the above described embodiments which calculate the arithmetic average of the output signals from the plurality of pixels, the adder 145 according to the present embodiment calculates the weighted average of the output signals.

FIG. 23 is a diagram for describing the pixel addition in the present embodiment. The pixel array of the present embodiment is the same as that of the sixth embodiment (FIG. 21). However, the pixels to be subject to the pixel addition in the present embodiment differs from those of the sixth embodiment. In the pixel addition of the present embodiment, a plurality of pixels Grs and Gbs placed to form a diamond shape are targeted.

FIG. 24 is a diagram illustrating positions of the respective pixels (R', Gb', Gr', B', and W') resulting from the pixel addition in the present embodiment. For example, the position R' indicates the centroid of the plurality of pixels Rs as in FIG. 22. The respective centroids R', B', Gr', Gb', and W' in the present embodiment are the same as those of the sixth embodiment.

The adder 145 performs the operation with the expression 11 below.

$$R'=(R1+R2+R4+R5)*(1-k)+R3*k$$

$$B'=(B1+B2+B4+B5)*(1-k)+B3*k$$

$$Gr'=(Gr1+Gr2+Gr4+Gr5)*(1-k)+Gr3*k$$

$$Gb'=(Gb1+Gb2+Gb4+Gb5)*(1-k)+Gb3*k$$

$$W'=(W1+W8)/2*q+(W2+W7)/2*r+(W3+W6)/2*s+(W4+W5)/2*t \quad \text{(Expression 11)}$$

In the operation based on the expression 11, the output signal R3 from the pixel R3 on the centroid R', for example, is added after multiplied by the coefficient k which is bigger than the coefficient multiplied by the other pixels Rs (R1, R2, R4, and R5). That is the case for the signals of the other colors B3, Gr3, and Gb3. As a result, the contribution by the signals from the pixels on the centroid to the result of the pixel addition can be increased.

Note that the coefficients k, q, r, s, and t in the Expression 11 are decided to meet the conditions indicated by the expression 12 below.

$$0 \leq k \leq 1, 0 \leq (q+r+s+t) \leq 1 \quad \text{(Expression 12)}$$

Note that, although the weighted mean is calculated based on the expression 11 in the present embodiment, the arithmetic mean may be calculated based on the expression 10.

8. Eighth Embodiment

The eighth embodiment will be described below with reference to FIG. 25 to FIG. 28. In the above described first to seventh embodiments, the CMOS image sensor 140 has the pixels Gs checkered on the pixel array. Unlike that, the present embodiment does not have the pixels Gs checkered. However, the present embodiment also has the respective pixels arrayed to output the result of the pixel addition in the Bayer array as in the above described first to seventh embodiments.

Figures 25, 26:
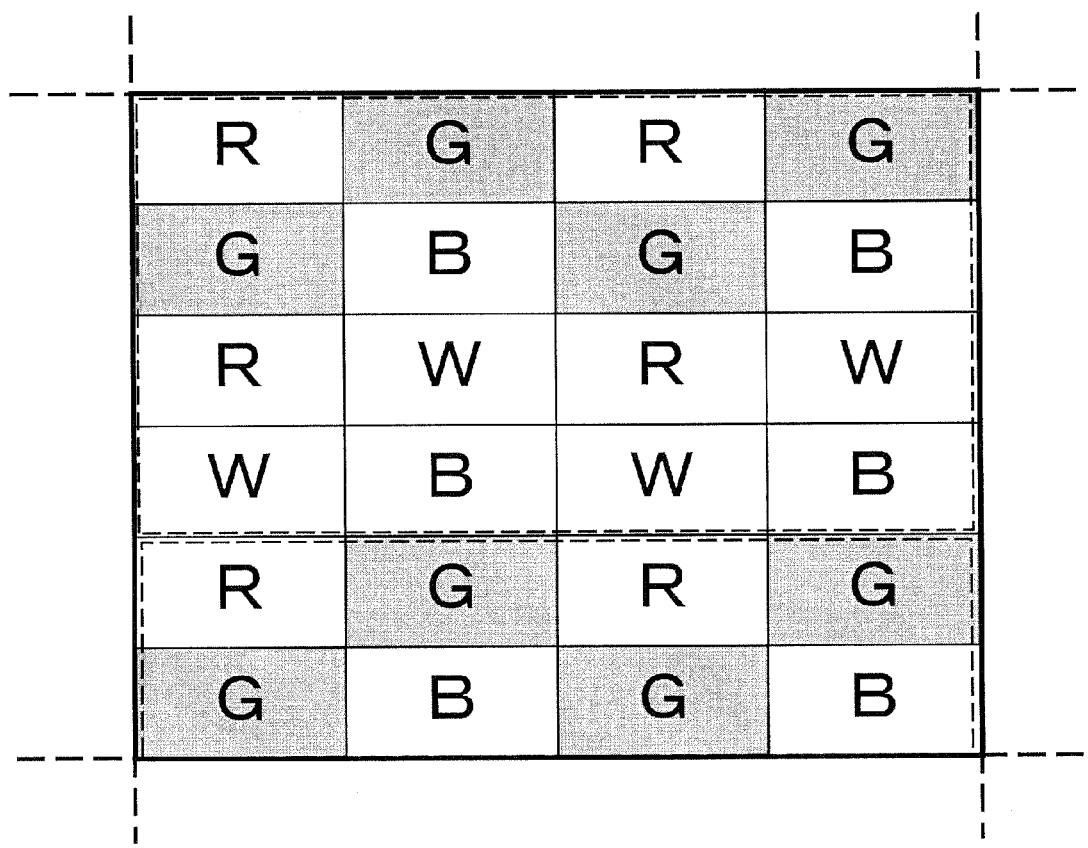
FIG. 25 is a diagram illustrating a basic array of color filters in an eighth embodiment.
FIG. 26 is a diagram illustrating a pixel array in a CMOS image sensor according to the eighth embodiment.

FIG. 25 is a diagram illustrating a basic array in the present embodiment. The CMOS image sensor 140 according to the present embodiment does not have the pixels Gs checkered, though, the CMOS image sensor 140 outputs the image signals so that the result of the pixel addition on the signals R, G, B, and W is arranged in the Bayer array. The basic array of the present embodiment is in four rows and four columns and includes four kinds of pixels R, G, B, and W as in the above described first to seventh embodiments.

FIG. 26 is a diagram illustrating the pixel array including the repeated basic arrays of the present embodiment (FIG. 25). FIG. 26 illustrates the pixel array with six rows and four columns, which is a part of the pixel array of the present embodiment, for convenience of explanation.

FIG. 27 is a diagram for describing the pixel addition in the present embodiment. The adder 145 according to the present embodiment adds six pixels with respect to the pixels R and B, and adds four pixels with respect to the pixels Gr, Gb, and W.

FIG. 28 is a diagram illustrating positions of the respective pixels R', Gb', Gr', B', and W' resulting from the pixel addition in the present embodiment. For example, the position R' indicates the centroid of the plurality of pixels Rs as in FIG. 22. The adder 145 outputs the signals R', Gb', Gr', B', and W' resulting from the pixel addition deemed signals generated at the positions R', Gb', Gr', B', and W', respectively.

The pixel addition according to the present embodiment can output the image signals so that the output signals Gs are checkered even though the CMOS image sensor 140 does not have the pixel array with the pixels Gs checkered.

9. Ninth Embodiment

The ninth embodiment will be described below with reference to FIG. 29 to FIG. 30. In the above described first to eighth embodiments, the pixels are arrayed horizontally and vertically in order (square array). Unlike them, the pixels of the present embodiment are diagonally arrayed (diagonal array).

Since the diagonal array of the pixel array makes the distance between the pixels as long as $1/\sqrt{2}$ of the square array, the embodiment is advantageous with respect to the resolution in horizontal and vertical directions.

Figure 29:
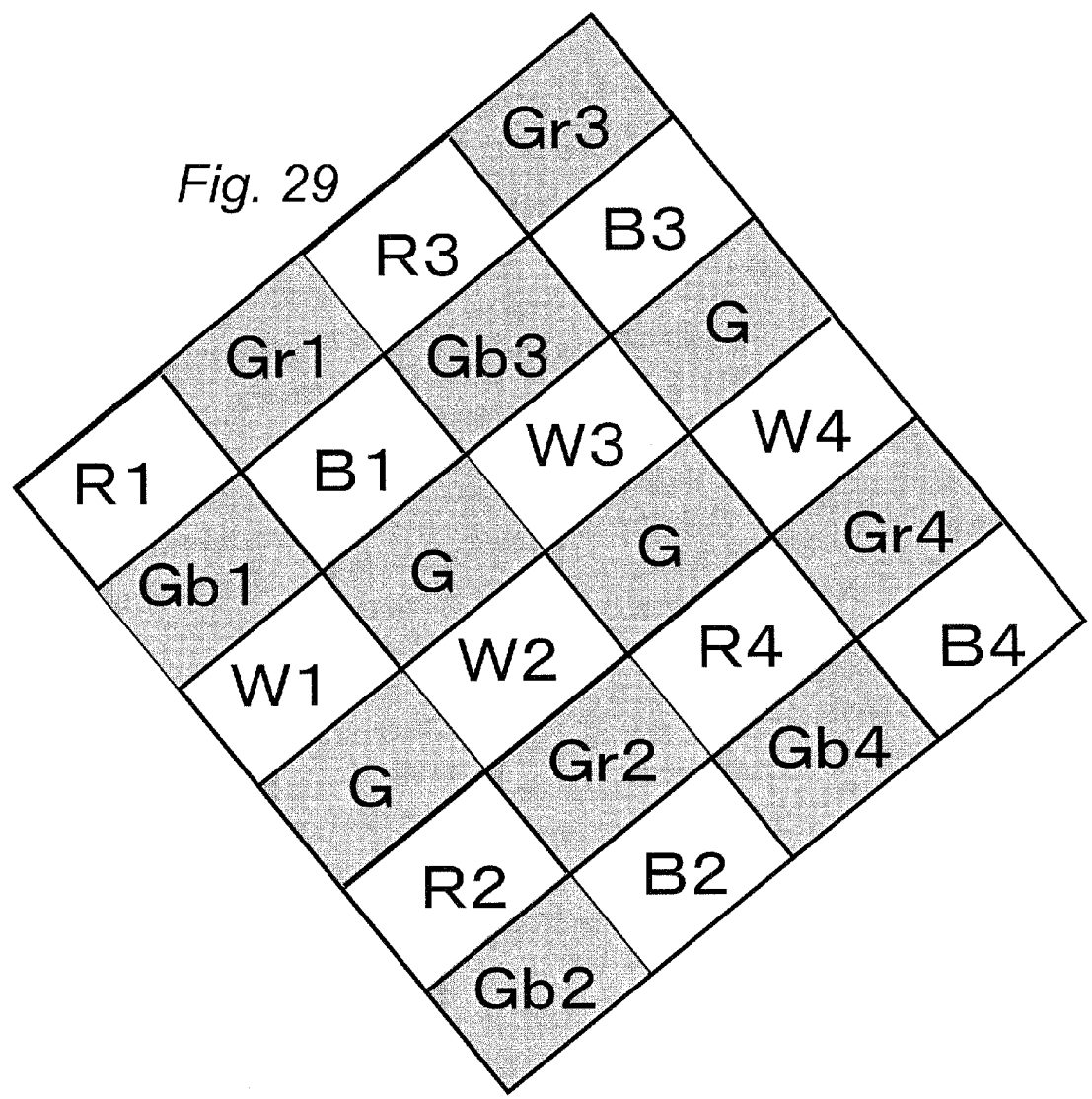
FIG. 29 is a diagram for describing the pixel addition in a ninth embodiment.

FIG. 29 is a diagram illustrating the pixel array in the present embodiment. The pixel array in the present embodiment is the pixel array in the first embodiment rotated by 45 degrees. The present embodiment is the same as the first embodiment except for that point.

The adder 145 performs the pixel addition on the output from the pixels arrayed as illustrated in FIG. 29. The operation performed at this time may be the same as that performed in the first embodiment (the expression 1). For example, the adder 145 adds up the signals Rs to generate the signal R'. That is the case for the signals of the other colors Gb, Gr, B, and W.

Figure 30:
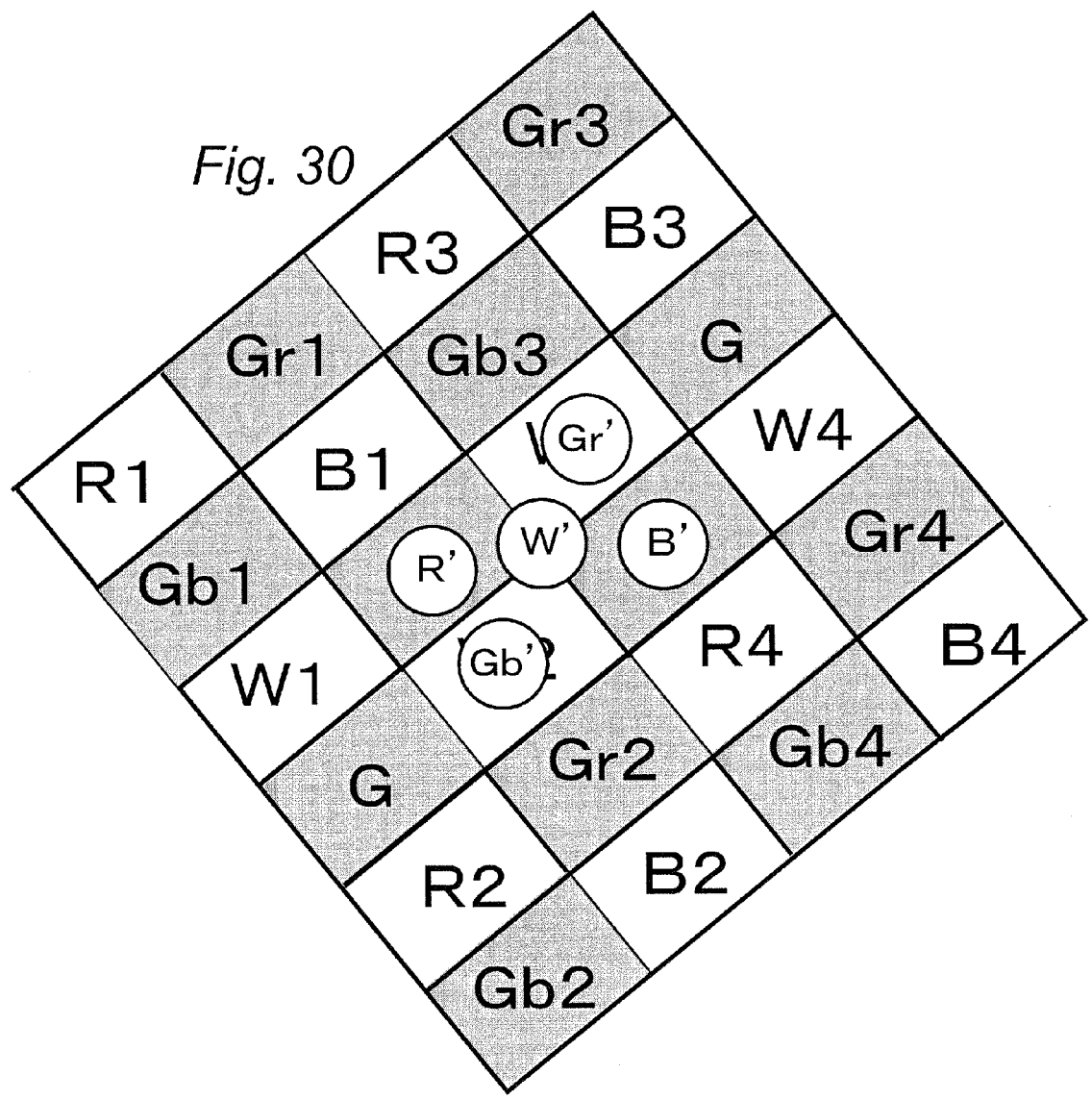
FIG. 30 is a diagram illustrating positions of the respective pixels resulting from the pixel addition in the ninth embodiment.

FIG. 30 is a diagram illustrating positions of the respective pixels R', Gb', Gr', B', and W' resulting from the pixel addition in the present embodiment. For example, the position R' indicates the centroid of the plurality of pixels Rs. That is the case for the other positions Gb', Gr', B', and W'.

The adder 145 outputs the signal R' generated by the pixel addition deemed a signal generated at the position R'. That is the case for the signals of the other colors Gb', Gr' B', and W'.

As described above, according to the present embodiment, the signals R', G', and B' can be output in the Bayer array pattern and the signal W' can be output to the center position of the Bayer array, even though the pixel array is the diagonal array. As a result, the present embodiment can reduce a load of image process as the above described embodiments can.

10. Tenth Embodiment

The tenth embodiment will be described below with reference to FIG. 31 to FIG. 32.

Figure 31:
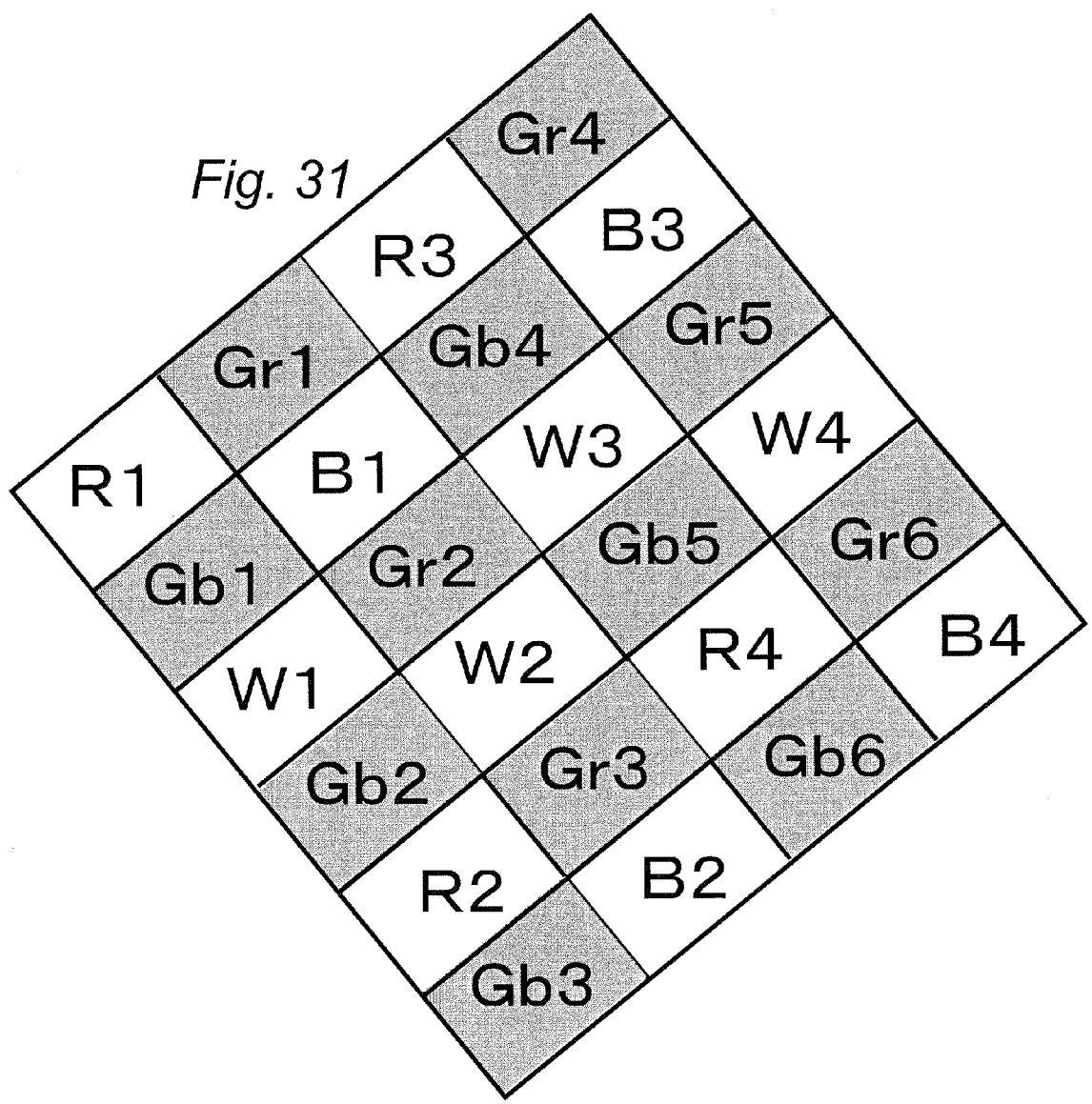
FIG. 31 is a diagram for describing the pixel addition in a tenth embodiment.

FIG. 31 is a diagram for describing the pixel addition in the present embodiment. The pixel array of the present embodiment is the same as that of the ninth embodiment (FIG. 29). In the ninth embodiment, four pixels are added up for each of the pixels Gbs and Grs. Unlike that, in the present embodiment, six pixels are added up for each of the pixels Gbs and Grs.

The adder 145 of the CMOS image sensor 140 performs the same operation as that performed in the pixel addition of the second embodiment (the expression 8) to generate the signals R', Gb', Gr', B', and W'.

Figure 32:
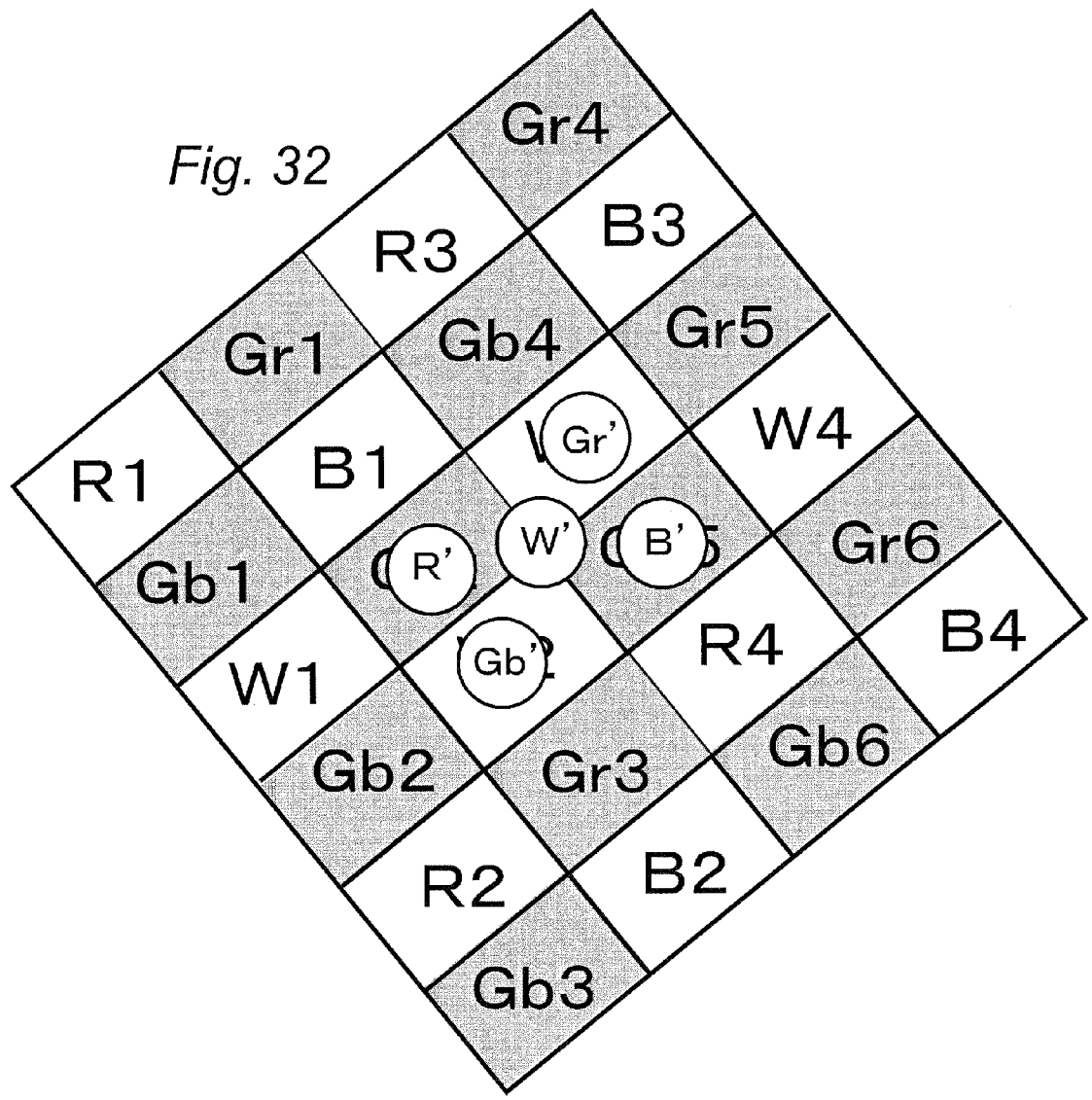
FIG. 32 is a diagram illustrating positions of the respective pixels resulting from the pixel addition in the tenth embodiment.

FIG. 32 is a diagram illustrating positions of the respective pixels (R', Gb', Gr', B', and W') resulting from the pixel addition in the present embodiment. The positions R', Gb', Gr', B', and W' indicate the centroids of the plurality of pixels R, Gb, Gr, B, and W, respectively. The adder 145 outputs the generated signals R', Gb', Gr', B', and W' deemed signals generated at the positions R', Gb', Gr', B', and W', respectively.

The present embodiment can also provide the same effect as that of the above described embodiments.

11. Eleventh Embodiment

The eleventh embodiment will be described below with reference to FIG. 33. In the first to tenth embodiments, the W filter is used in the array of the color filters of the CMOS image sensor 140, but in the present embodiment, a yellow filter (hereinafter, referred to as "Ye filter") is used instead of the W filter. Herein, The Ye filter according to the present embodiment has higher light transmittance than that of the G filter of the CMOS image sensor 140.

FIG. 33 is a diagram illustrating the pixel array in the present embodiment. The present embodiment is the same as the first embodiment (FIG. 5) except that the W filter is substituted for the Ye filter. On the output signals from the respective pixels illustrated in FIG. 33, the adder 145 according to the present embodiment performs the same operation as that performed in the pixel addition in the first embodiment (the expression 1) to output the signals resulting from the operation to the centroids of the respective pixels.

The Ye filter is used in the present embodiment as a color filter which has higher light transmittance than that of the G filter. However, filters other than the Ye filter may be used as far as the filters have higher light transmittance than that of the G filter.

12. Twelfth Embodiment

The twelfth embodiment will be described below with reference to FIG. 34.

FIG. 34 is a diagram illustrating the pixel array in the present embodiment. In the present embodiment, a Ye filter, for example, is substituted for the R filter, and a cyan colored filter (hereinafter, referred to as "Cy filter") is substituted for the B filter.

On the signals obtained from the respective pixels illustrated in FIG. 34, the adder 145 according to the present embodiment performs the pixel addition so that the signals (image information) output to the ADC 150 are in the Bayer array pattern as in the first to eleventh embodiments.

Note that the Ye filter and the Cy filter are used in the present embodiment, though, color filters other than the Ye filter and the Cy filter may be used. That is, the color filters may be arrayed so that the result of the pixel addition makes the output in the Bayer array.

13. Other Embodiments

The embodiments have been described above. However, the idea of the above described embodiments is not limited to the above described embodiments. Other embodiments to which the idea of the above described embodiments can be applied will be described below together.

Although the CMOS image sensor 140 is exemplified as an imaging device in the above described embodiments, the imaging device is not limited to that. For example, the imaging device may be implemented with a CCD image sensor or an NMOS image sensor.

In the above described embodiments, the pixel addition is not performed in shooting a still image. However, the pixel addition may also be performed in shooting a still image. For example, the pixel addition may be performed in continuous shooting.

Further, both the image processor 160 and the controller 180 may be implemented with a single semiconductor chip or may be implemented with separate semiconductor chips.

Although the CMOS image sensor 140 has the adder 145 therein that performs the pixel addition to output the added up pixels in the above described embodiments, the idea of the above described embodiments is not limited to that. That is, an arithmetic processor (for example, the image processor 160) in the stage later than the CMOS image sensor 140 may be adapted to perform the pixel addition. Also thereby, a signal (image information) can be output more efficiently.

As described above, according to the above described embodiments, the array of the signals generated by the CMOS image sensor 140 can be converted into the array of the Bayer pattern of high process efficiency, by the pixel addition. As a result, even when a highly fine image sensor dedicated for taking a still image is used in shooting a moving image, the image sensor can efficiently perform pixel process, therefore, an adequate frame rate can be set more easily also in shooting a moving image.

INDUSTRIAL APPLICABILITY

The idea of the above described embodiments can be applied not only to the video camera 100 but also to a digital still camera, an information terminal in which an imaging device is installed, and the like.

What is claimed is:
1. An imaging apparatus comprising an imaging device which includes a plurality of pixels and is operable to generate image information for each pixel from received light, wherein
each of the plurality of pixels includes one of first to fourth color filters, each of the first to the fourth color filters has different spectral characteristics, the fourth color filter has the highest light transmittance among the color filters, the first to the fourth color filters are arranged in a specific array, the specific array for the first to third color filters except for the fourth filter is not a Bayer array, the specific array has first to third centroids which make a Bayer array, the first centroid is a centroid of a plurality of pixels which are used in a first pixel addition process performed on pixel information generated based on lights transmitted through the first color filters, the second centroid is a centroid of a plurality of pixels which are used in a second pixel addition process performed on the pixel information generated based on lights transmitted through the second color filters, and the third centroid is a centroid of a plurality of pixels which are used in a third pixel addition process performed on the pixel information generated based on lights transmitted through the third color filters, and pixel information regarding a color corresponding to the first color filters is generated by the first pixel addition process, pixel information regarding a color corresponding to the second color filters is generated by the second pixel addition process, and pixel information regarding a color corresponding to the third color filters is generated by the third pixel addition process.

2. The imaging apparatus according to claim 1, wherein the fourth color filters are arrayed so that the centroid of the plurality of pixels which are used in a fourth pixel addition process performed on the pixel information generated based on lights transmitted through the fourth color filters is placed at the centroid of the first to the third centroids, pixel information regarding a color corresponding to the fourth color filters is generated by the fourth pixel addition process.

3. The imaging apparatus according to claim 2, wherein the fourth color filter is a W filter.

4. The imaging apparatus according to claim 1, wherein the third color filters are arranged in checkered pattern.

5. The imaging apparatus according to claim 1, wherein weight set in each of the first to third pixel addition processes is made more on a pixel closer to the centroid of the pixels.

6. The imaging apparatus according to claim 1, wherein the imaging device has a pixel adder which performs the first to third pixel addition processes.

7. The imaging apparatus according to claim 1, wherein the first color filter is an R filter, the second color filter is a B filter, and the third color filter is a G filter.

8. The imaging apparatus according to claim 1, wherein the imaging apparatus further includes an adder operable to perform pixel addition on an output signal from each pixel during a pixel addition mode, and to not perform the pixel addition during a pixel non-addition mode.

9. The imaging apparatus according to claim 8, wherein the pixel addition mode and pixel non-addition mode of the adder are selectable by a user.

10. An imaging device which comprises a plurality of pixels and is operable to generate image information for each pixel from a received light, wherein each of the plurality of pixels includes one of first to fourth color filters, each of the first to the fourth color filters have different spectral characteristics, the fourth color filter has the highest light transmittance among the color filters, the first to the fourth color filters are arranged in a specific array, the specific array for the first to third color filters except for the fourth filter is not a Bayer array, the specific array has first to third centroids which make a Bayer array, the first centroid is a centroid of a plurality of pixels which are used in a first pixel addition process performed on pixel information generated based on light transmitted through the first color filters, the second centroid is a centroid of a plurality of pixels which are used in a second pixel addition process performed on the pixel information generated based on light transmitted through the second color filters, and the third centroid is a centroid of a plurality of pixels which are used in a third pixel addition process performed on the pixel information generated based on light transmitted through the third color filters, and pixel information regarding a color corresponding to the first color filters is generated by the first pixel addition process, pixel information regarding a color corresponding to the second color filters is generated by the second pixel addition process, and pixel information regarding a color corresponding to the third color filters is generated by the third pixel addition process.

11. The imaging device according to claim 10, wherein the fourth color filters are arrayed so that the centroid of the plurality of pixels which are used in a fourth pixel addition process performed on the pixel information generated based on light transmitted through the fourth color filters is placed at the centroid of the first to the third centroids, pixel information regarding a color corresponding to the fourth color filters is generated by the fourth pixel addition process.

12. The imaging device according to claim 10, wherein the third color filters are arranged in checkered pattern.

13. The imaging device according to claim 10, wherein weight set in each of the first to third pixel addition processes is made more on a pixel closer to the centroid of the pixels.

14. The imaging device according to claim 10, wherein the imaging device has a pixel adder which performs the first to third pixel addition processes.

15. The imaging device according to claim 10, wherein the first color filter is an R filter, the second color filter is a B filter, and the third color filter is a G filter.

16. The imaging device according to claim 10, wherein the fourth color filter is a W filter.

17. The imaging device according to claim 10, wherein the imaging device further includes an adder operable to perform pixel addition on an output signal from each pixel during a pixel addition mode, and to not perform the pixel addition during a pixel non-addition mode.

18. The imaging device according to claim 17, wherein the pixel addition mode and pixel non-addition mode of the adder are selectable by a user.

* * * * *